(12) United States Patent
Kimura et al.

(10) Patent No.: US 7,158,331 B2
(45) Date of Patent: Jan. 2, 2007

(54) DISK DRIVE HAVING CONTROL CIRCUIT BOARD MOUNTED OUTSIDE CASING AND HEAD ACTUATOR COUPLED CAPACITOR MOUNTED INSIDE CASING ON PRINTED CIRCUIT BOARD

(75) Inventors: Akihiro Kimura, Akishima (JP); Kazuhito Shimomura, Fussa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/066,867

(22) Filed: Feb. 25, 2005

(65) Prior Publication Data
US 2005/0264915 A1 Dec. 1, 2005

(30) Foreign Application Priority Data
May 31, 2004 (JP) .............................. 2004-161421

(51) Int. Cl.
*G11B 21/02* (2006.01)
*G11B 21/08* (2006.01)
(52) U.S. Cl. .................... 360/75; 360/264.2; 360/245.9
(58) Field of Classification Search ..................... None
See application file for complete search history.

(56) References Cited

U.S. PATENT DOCUMENTS

| 4,979,062 | A |  | 12/1990 | Stefansky et al. |
|---|---|---|---|---|
| 5,426,549 | A | * | 6/1995 | Sakai ....................... 360/264.2 |
| 6,181,501 | B1 | * | 1/2001 | Yamazaki .................... 360/67 |
| 6,316,898 | B1 | * | 11/2001 | Albrecht et al. ............ 318/560 |
| 6,567,232 | B1 | * | 5/2003 | Klaassen ..................... 360/75 |
| 6,934,126 | B1 | * | 8/2005 | Berding et al. .......... 360/264.2 |
| 2002/0141102 | A1 | * | 10/2002 | Kusumoto .................... 360/75 |
| 2003/0016468 | A1 | * | 1/2003 | Hayakawa et al. ...... 360/97.01 |
| 2003/0081348 | A1 |  | 5/2003 | Watanabe et al. |
| 2003/0142447 | A1 | * | 7/2003 | Sakamoto et al. ....... 360/245.9 |
| 2004/0100723 | A1 |  | 5/2004 | Yao et al. |
| 2005/0068656 | A1 | * | 3/2005 | Salina et al. .................. 360/75 |

FOREIGN PATENT DOCUMENTS

JP 2001-210058 8/2001

* cited by examiner

*Primary Examiner*—Andrew L. Sniezek
(74) *Attorney, Agent, or Firm*—Foley & Lardner LLP

(57) ABSTRACT

A disk drive includes a casing which houses a disk-shaped recording medium, a drive motor which holds and rotates the recording medium, a head which performs read/write operations, a head actuator movably supporting the head to move the head relative to the recording medium, and a board unit connected to the head actuator. The board unit has a board main body arranged on the inner surface of the casing and at least one capacitor, mounted on the board main body for supplying power to perform a retracting operation for permitting the head actuator to move the head to a retracted position.

14 Claims, 6 Drawing Sheets

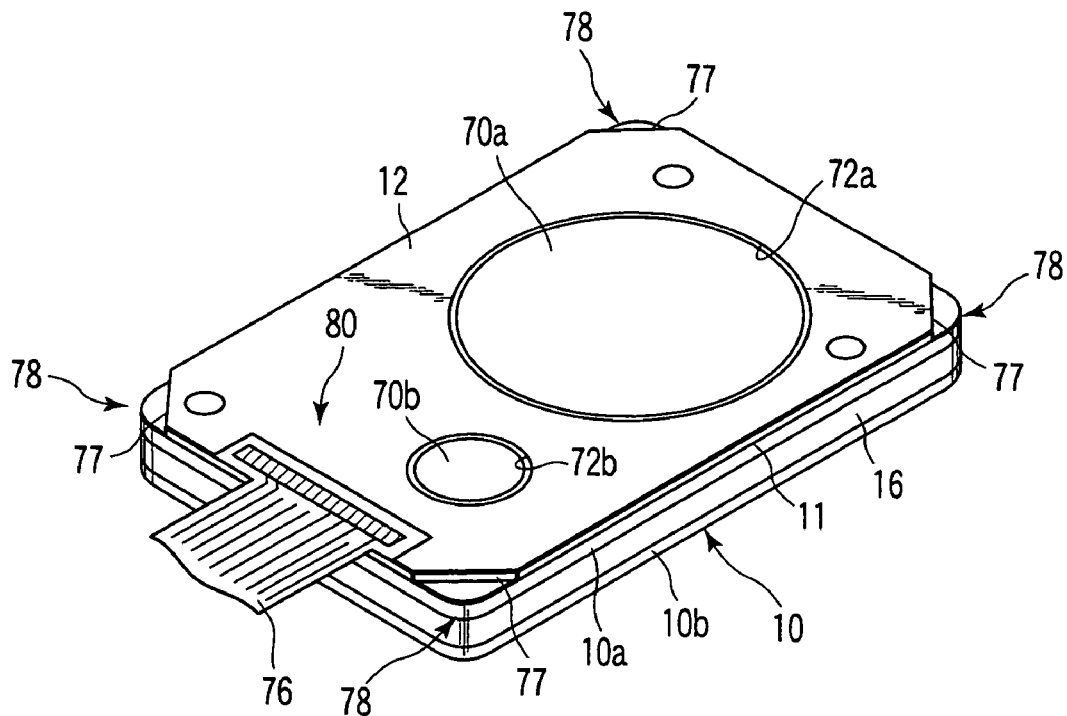
F I G. 4
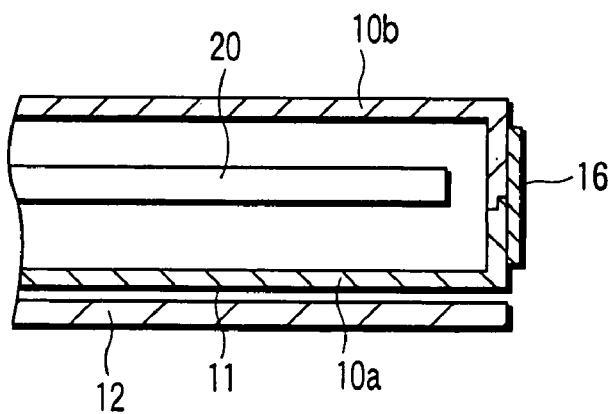
F I G. 5

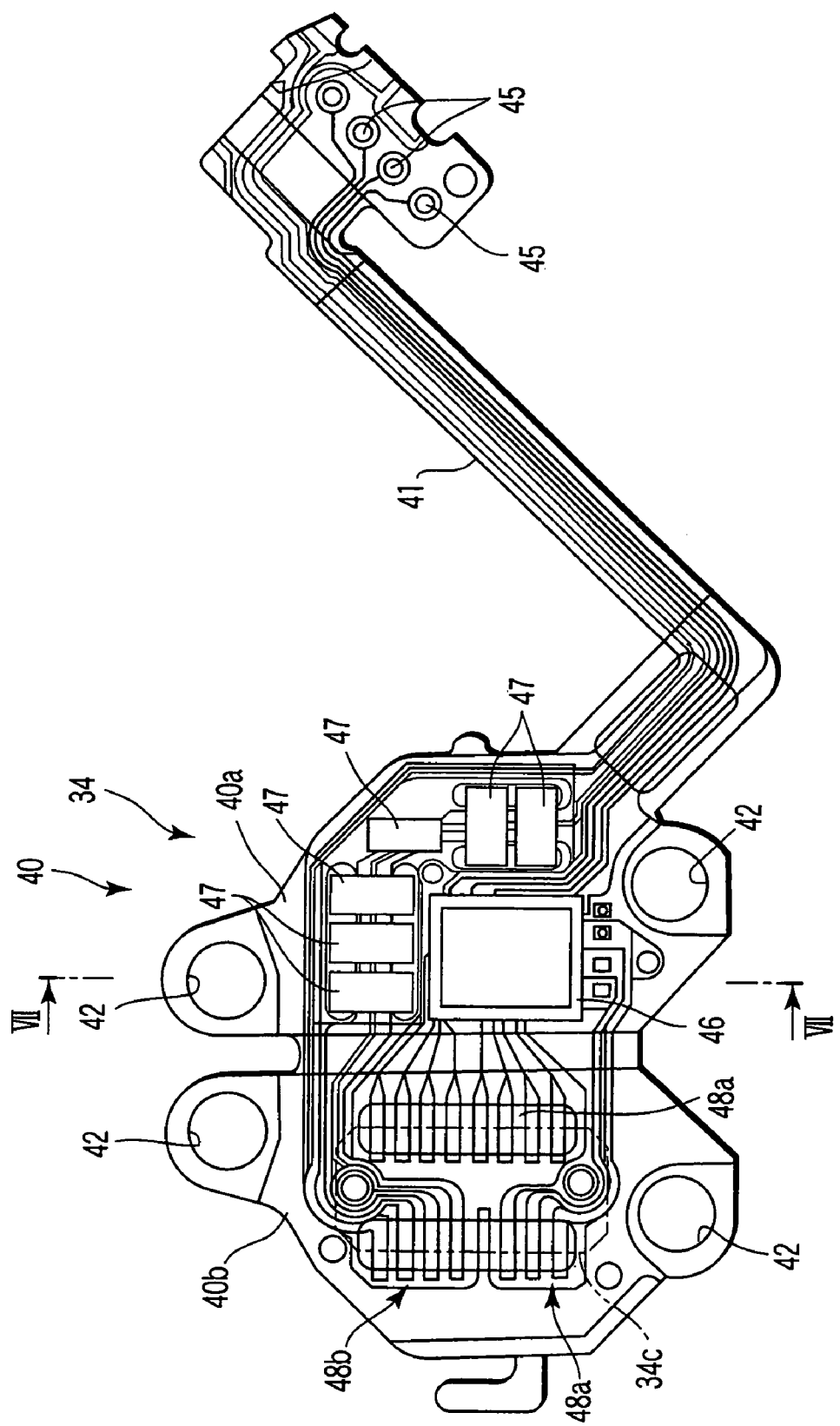
F I G. 6

DISK DRIVE HAVING CONTROL CIRCUIT BOARD MOUNTED OUTSIDE CASING AND HEAD ACTUATOR COUPLED CAPACITOR MOUNTED INSIDE CASING ON PRINTED CIRCUIT BOARD

CROSS-REFERENCE TO RELATED APPLICATIONS

This application is based upon and claims the benefit of priority from prior Japanese Patent Application No. 2004-161421, filed May 31, 2004, the entire contents of which are incorporated herein by reference.

BACKGROUND OF THE INVENTION

1. Field of the Invention

The present invention relates to a disk drive having housed therein a disk for use as a recording medium.

2. Description of the Related Art

In recent years, disk drives such as magnetic disk drives, optical disk drives, etc. have been widely used as external recording devices or image recording devices for computers.

A magnetic disk drive, serving as a disk drive, generally has a casing in the shape of a rectangular box. The casing houses a magnetic disk serving as a magnetic recording medium, a spindle motor serving as a drive means for supporting and rotating the magnetic disk, a plurality of magnetic heads for writing information to and reading information from the magnetic disk, a head actuator for movably holding the magnetic heads relative to the magnetic disk, a voice coil motor for pivoting and positioning the head actuator, and a board unit having arranged thereon a head amplifier and the like.

A printed circuit board that controls the operations of the spindle motor, voice coil motor, and magnetic heads is screwed to the outer surface of the casing with the board unit arranged therebetween. An interface (I/F) connector for connecting the magnetic disk drive to an external device is mounted on an end portion of the printed circuit board.

Described in Jpn. Pat. Appln. KOKAI Publication No. 2001-210058 discloses a magnetic disk drive in the form of a thin card which can be loaded into a card slot of a personal computer, for example. The card-shaped magnetic disk drive of this type is required to be made thinner and smaller than a conventional one. To meet this requirement, various components are mounted on a plate-shaped base, a support frame is fixed on the peripheral edge of the base, and a plate-shaped top cover is attached to the support frame. Further, a printed circuit board is arranged on the backside of the base, and an I/F connector on the printed circuit board is positioned and held by means of a dedicated fixing member on the support frame.

Furthermore, miniaturization of magnetic disk drives these days is being promoted so that they can be used as recording devices for a wider variety of electronic devices, especially for smaller-sized electronic devices. For example, in a magnetic disk drive having housed therein a disk whose diameter is one inch or more, a printed circuit board, which is so arranged as to overlap the surface of a casing, can be made smaller than the area of the casing surface. However, in a magnetic disk drive having housed therein a disk whose diameter is one inch or less, a printed circuit board is required to be made small due to miniaturization of a casing. Accordingly, the setting space on a printed circuit board is reduced, which makes it difficult to mount a plurality of electronic components thereon. Generally, a magnetic disk drive is provided with a capacitor for a retracting operation which stores electric charge to move the magnetic heads to the retreated position when the power is unexpectedly turned off. Since the capacitor is comparatively large in capacity and dimensions, it becomes difficult to mount the capacitor on a printed circuit board, and the entire magnetic disk drive including the printed circuit board is prevented from being reduced in thickness.

BRIEF SUMMARY OF THE INVENTION

According to an aspect of the invention, a disk drive comprises: a casing; a disk-shaped recording medium arranged in the casing; a drive motor which is arranged in the casing and which holds and rotates the recording medium; a head which performs information processing for the recording medium; a head actuator arranged in the casing and movably supporting the head to move the head relative to the recording medium; a board unit arranged in the casing and connected to the head actuator; and a control circuit board arranged to face an outer surface of the casing and connected to the board unit. The board unit includes a board main body arranged on an inner surface of the casing and at least one capacitor, mounted on the board main body, for supplying power to permit the head actuator to move the head to a retracted position.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 4 is a perspective view showing the HDD when viewed from the side of a control circuit board;

FIG. 5 is a cross-sectional view of the HDD taken along a line V—V in FIG. 1;

FIG. 6 is an expanded plan view of a board unit of the HDD;

DETAILED DESCRIPTION OF THE INVENTION

Referring to the accompanying drawings, an HDD according to a first embodiment of the present invention will be described in detail.

Figure 1:
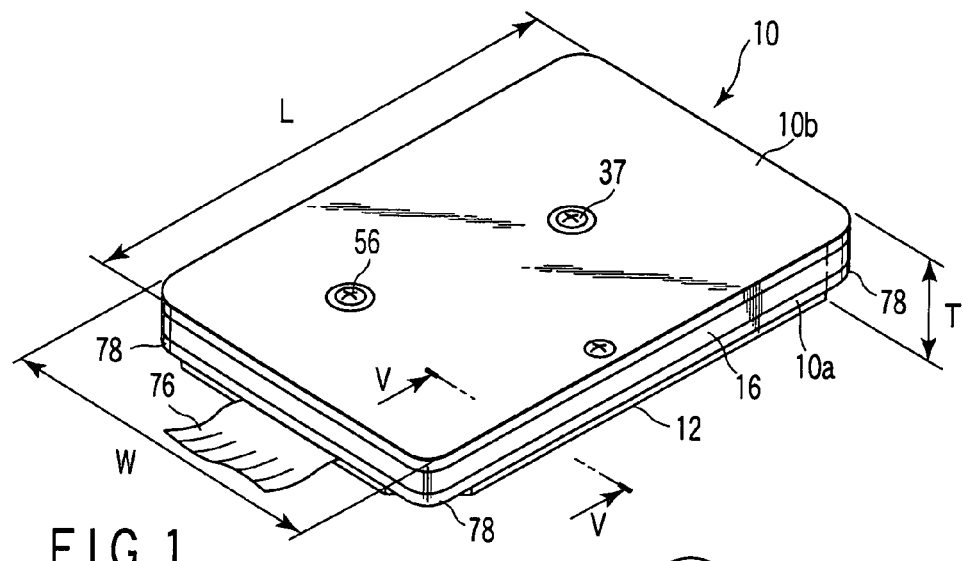
FIG. 1 is a perspective view showing an hard disk drive (hereinafter referred as an HDD) according to a first embodiment of the present invention.
Figure 2:
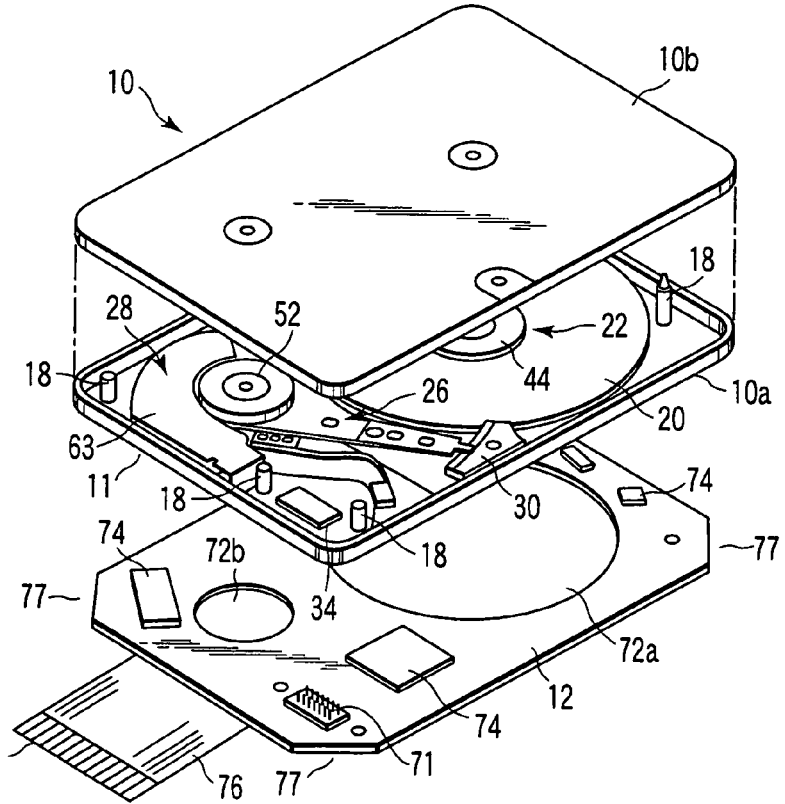
FIG. 2 is an exploded perspective view showing the HDD.
Figure 3:
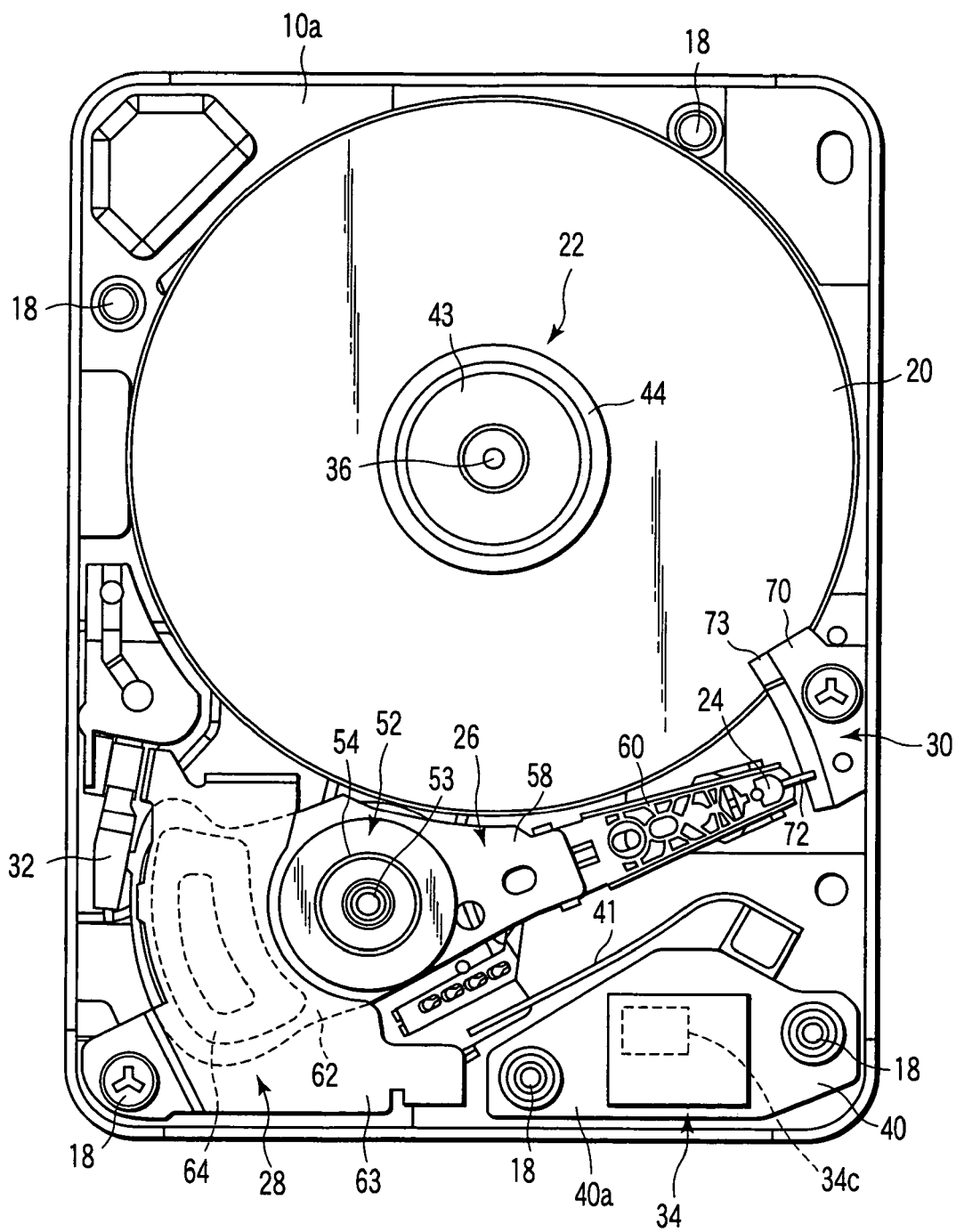
FIG. 3 is a plan view of a casing and the internal structure of the HDD.

As shown in FIGS. 1 and 2, the HDD comprises a casing 10 substantially in the shape of a rectangular box that houses various components, which will be mentioned later, and a rectangular control circuit board 12 that is so arranged as to overlap an outer surface of the casing 10. The casing 10 and the control circuit board 12 have a length L of 32 mm and a width W of 24 mm, and a thickness T, including the thicknesses of the casing and the control circuit board, of 3 mm to 6 mm. The thickness T is set to be approximately 3.3 mm or 5 mm depending on the number of disks to be housed in the casing 10.

As shown in FIG. 2 to FIG. 5, the casing 10 includes first and second shells 10a and 10b, which have substantially equal dimensions. The first and second shells 10a and 10 b are formed of a metal and have a rectangular structure with sidewalls on their respective peripheral edge portions. The first and second shells 10a and 10b are so arranged as to face each other with their peripheral edge portions (e.g. sidewalls) in contact with each other. A belt-shaped sealing member 16 is wound around the peripheral edge portions of the first and second shells 10a and 10b so that the peripheral edge portions are secured connected to each other and the interior region between the shells are sealed. In this way, the casing 10 in the shape of a rectangular box is configured.

The bottom surface of the first shell 10a configures a rectangular mount surface 11. Four corners of the casing 10, including the corners of the mount surface 11, are rounded, forming circular arcs. As a result, the sealing member 16 wound around the peripheral edge portions of the casing 10 is prevented from being damaged by the corners of the casing, and deterioration of airtightness due to release or unsticking of the sealing member 16 is prevented.

A plurality of support posts 18 are arranged on the peripheral edge portions at the inside of the casing 10. Each support post 18 has a proximal end that is fixed to the inner surface of the first shell 10a, and is substantially perpendicular to the inner surface of the first shell. The mount surface 11 is provided with screw holes at positions corresponding to the respective support posts 18, which extend into the inside of the support posts.

The casing 10 houses a magnetic disk 20 having a diameter of, e.g., 0.85 inches and serving as an information recording medium, a spindle motor 22 serving as a drive motor for holding and rotating the magnetic disk, a magnetic head 24 for writing information to and reading information from the magnetic disk, a carriage 26 for movably holding the magnetic head relative to the magnetic disk 20, a voice coil motor (referred to as VCM, hereinafter) 28 for pivoting and positioning the carriage, a ramp load mechanism 30 for unloading the magnetic head to a position away from the magnetic disk and holding the magnetic head thereat when the magnetic head is moved to the outer peripheral portion of the magnetic disk, an electromagnetic latch 32 for holding the carriage in a retreated position, and a board unit 34 mounted with a head amplifier and the like.

The spindle motor 22 is mounted on the first shell 10a. The spindle motor 22 has a spindle 36 that is fixed to the inner surface of the first shell 10a, and is substantially perpendicular to the inner surface. The extended end of the spindle 36 is fixed to the second shell 10b by a fixing screw 37 that is screwed into the second shell from outside. Thus, the spindle 36 is supported by the first and second shells 10a and 10b from both sides.

A bearing, not shown, rotatably supports a rotor on the spindle 36. The end portion of the rotor on the side of the second shell 10b constitutes a columnar hub 43, on which the magnetic disk 20 is coaxially fitted. A clamp ring 44 in the form of a ring is fitted on the end portion of the hub 43, thereby holding the inner peripheral portion of the magnetic disk 20. Thus, the magnetic disk 20 is fixed to the rotor and rotatable integrally with the rotor.

A ring-shaped permanent magnet, not shown, is fixed to the end portion of the rotor on the side of the first shell 10a such that the permanent magnet is coaxial with the rotor. The spindle motor 22 has a stator core attached to the first shell 10a, and a plurality of coils wound around the stator core. The stator core and the coils are located outside the permanent magnet with a gap arranged therebetween.

The carriage 26, which constitutes a head actuator, is provided with a bearing assembly 52 that is fixed to the inner surface of the first shell 10a. The bearing assembly 52 has a pivot 53 that is perpendicularly fixed to the inner surface of the first shell 10a, and a cylindrical hub 54 that is rotatably supported by the pivot 53 using a pair of bearings. The extended end of the pivot 53 is fixed to the second shell 10b by a fixing screw 56 that is screwed into the second shell from outside. Thus, the pivot 53 is supported by the first and second shells 10a and 10b from both sides. The bearing assembly 52 serving as a bearing unit is arranged collaterally with the spindle motor 22 along the longitudinal direction of the casing 10.

The carriage 26 is provided with arms 58 extending from the hub 54, suspensions 60 in the form of an elongated plate extending from the respective distal ends of the arms, and a support frame 62 extending from the hub 54 in a direction opposite to the extending direction of the arms. The extended end of each suspension 60 supports the magnetic head 24 through a gimbal portion, not shown. A predetermined head load, brought about by spring force of the suspension 60, is applied to the magnetic head 24 in a direction toward the surface of the magnetic disk 20. A voice coil 64, constituting the VCM 28, is fixed to the support frame 62.

The VCM 28, which rotates the carriage 26 around the bearing assembly 52, includes a pair of yokes 63 which are fixed to the first shell 10a and face each other with a gap provided therebetween, and a magnet, not shown, which is fixed to the inner surface of one of the yokes and faces the voice coil 64. When the voice coil 64 is energized, the carriage 26 pivots between the retreated position shown in FIG. 3 and the operating position located over the surface of the magnetic disk 20. Thereupon, the magnetic head 24 is positioned on a desired track of the magnetic disk 20. The electromagnetic latch 32, which is fixed to the first shell 10a, latches the carriage 26 in the retreated position, thereby preventing the carriage 26 from moving from the retreated position to the operating position when the HDD is subjected to external force such as shock.

The ramp load mechanism 30 includes a ramp member 70 that is fixed to the inner surface of the first shell 10a and faces the outer peripheral portion of the magnetic disk 20, and a tab 72 that extends from the distal end of each suspension 60 and serves as an engaging member. The ramp member 70 is formed by bending a plate member and has ramp surfaces 73 with which the tabs 72 can engage. When the carriage 26 rotates from the inner peripheral portion of the magnetic disk 20 to the retreated position located outside of the outer peripheral portion of the magnetic disk, the tabs 72 engage with the ramp surfaces 73 of the ramp member 70. Thereafter, the tabs 72 are pulled up by the inclination of the ramp surfaces, whereupon the magnetic heads 24 are unloaded. When the carriage 26 rotates to the retreated position, the tabs 72 are supported on the ramp surfaces 73 of the ramp member 70, and the magnetic head 24 is kept at a distance from the surface of the magnetic disk 20.

As shown in FIG. 2, FIG. 3, FIG. 6, and FIG. 7, the board unit 34 has a board main body 40 and a main flexible printed circuit board (referred to as main FPC, hereinafter) 41 which extends from the board main body. The board main body 40 and the main FPC are integrally formed of a flexible printed circuit board. The board main body 40 has a base portion 40a and a cover portion 40b which are substantially of the same shape. Both ends of the base portion 40a and the cover portion 40b are provided with through holes 42 through which the support posts 18 can be passed.

On the inner surface of the base portion 40a are mounted a head amplifier 46 and a plurality of, for example, six capacitors 47, for a retracting operation. The head amplifier 46 is formed of a substantially rectangular bare chip, and has a height of approximately 0.4 mm. Each capacitor 47 is configured by, for example, a rectangular tantalum capacitor with its height made higher than that of the head amplifier 46, or set to be approximately 0.8 mm. The outer surface of the capacitor 47 is covered with resin. The six capacitors 47 are so arranged around the head amplifier 46 as to enclose the head amplifier.

The six capacitors 47 function as capacitors for a retracting operation, and store electric charge when the HDD is operated, and drive the head actuator using the stored electric charge to move the magnetic head 24 to the retreated position when the power is unexpectedly turned off. Each capacitor 47 has its capacity set to be, for example, 10 µF, and the total capacity of the six capacitors 47 comes to 60 µF. It is desired that the total capacity of the capacitors 47 be set to be more than or equal to 50 µF.

On the cover portion 40b of the board main body 40 are provided a plurality of connection terminals 48a which are connected to the head amplifier 46 respectively, and a plurality of connection terminals 48b which are connected to the capacitors 47 respectively. A connector 34c is mounted on the cover portion 40b to overlap the connection terminals 48a, 48b and connected thereto.

The board main body 40 is folded along the portion 40d (see FIGS. 6 and 9) so that the backs of the cover portion 40b and base portion 40a are facing each other. The board main body 40 is fixed to a predetermined position on the first shell 10a by making the support posts 18 pass through the through holes 42 with the cover portion 40b facing the inner surface of the first shell 10a. The connector 34c arranged on the cover portion 40b is at least partially positioned on and opposed to the head amplifier 46 with the base portion 40a and cover portion 40b sandwiched therebetween. The connector 34c is exposed to the mount surface 11 of the first shell 10a through an opening formed in the first shell 10a.

The main FPC 41 extends from the base portion 40a, and the extended end thereof is provided with a plurality of connection pads 45. The extended end of the main FPC 41 is connected to the carriage 26 at the vicinity of the bearing assembly 52, and the connection pads 45 are electrically connected to the magnetic heads 24 through a cable, not shown, arranged on the arms 58 and suspensions 60.

Figure 7:
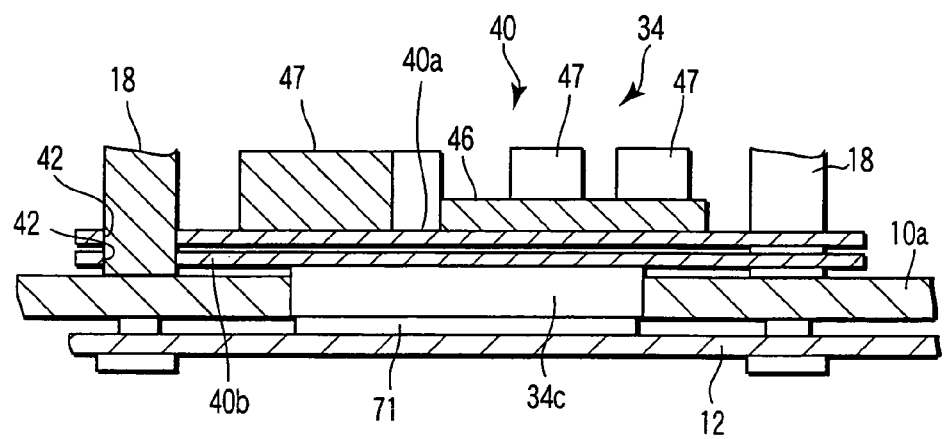
FIG. 7 is a cross-sectional view of the board unit taken along line VII—VII of FIG. 6 with the first shell 10a and the control circuit board 12 added thereto.

As shown in FIG. 2, FIG. 4, and FIG. 7, the control circuit board 12 formed of a printed circuit board is of a rectangular shape whose length and width are substantially equal to those of the mount surface 11 of the casing 10. The mount surface 11 has a circular convex surface 70a corresponding to the spindle motor 22 and a circular convex surface 70b corresponding to the bearing assembly 52. The control circuit board 12 is provided with circular openings 72a, 72b corresponding to the convex surfaces 70a, 70b, respectively.

The control circuit board 12 has its four corners cut off obliquely such that the respective cut-off lines define angles of 45 degrees relative to the respective sides of the circuit board 12, forming cut-off portions 77.

A plurality of electronic components 74 and a connector 71 are mounted on the inner surface of the control circuit board 12 which faces the casing 10. A flexible printed circuit board 76 for electrically connecting the HDD to an external device is connected to the control circuit board 12. The flexible printed circuit board 76 is drawn from one of the short sides of the control circuit board 12, and is provided with a plurality of connecting terminals 75 at the extended end thereof.

The thus-formed control circuit board 12 is arranged to overlap the mount surface 11 of the casing 10, and fixed to the first shell 10a using a plurality of screws. At this time, the four sides of the control circuit board 12 mate with the four sides of the mount surface 11. The convex surfaces 70a, 70b formed on the mount surface 11 are arranged within the openings 72a, 72b of the control circuit board 12. The connector 71 mounted on the control circuit board 12 is connected to the connector 34c of the board unit 34.

The cut-off portions 77 formed at the four corners of the control circuit board 12 correspond to the four corners of the mount surface 11, respectively. Thus, the four corners of the mount surface 11 are exposed to the exterior without being covered by the control circuit board 12. The four corners of the casing 10 including the exposed four corners of the mount surface 11 constitute holding potions 78 for holding the casing 10 without coming into contact with the control circuit board 12.

According to thus configured HDD, the capacitors 47 for a retracting operation are mounted on the board unit 34 within the casing 10. Thus, the capacitors 47, which are comparatively large in dimensions and capacity, are not required to be mounted on the control circuit board 12, which can miniaturize the control circuit board as well as reduce the thickness thereof. Accordingly, an HDD that is further miniaturized and used as a recording device for a wider variety of electronic devices can be realized. The card-shaped, portable HDD constructed in this manner can be used as a recording device for various electronic devices such as cellular phones, digital cameras, video cameras, personal digital assistants (PDA), etc.

The capacitors 47 are arranged around the head amplifier 46 and have a height higher than that of the head amplifier. Therefore, if any external force acts on the casing 10, or when the connectors 34c and 71 are connected, the capacitors 47 can protect the head amplifier 46, and prevent the head amplifier from being affected by the impact.

Figure 8:
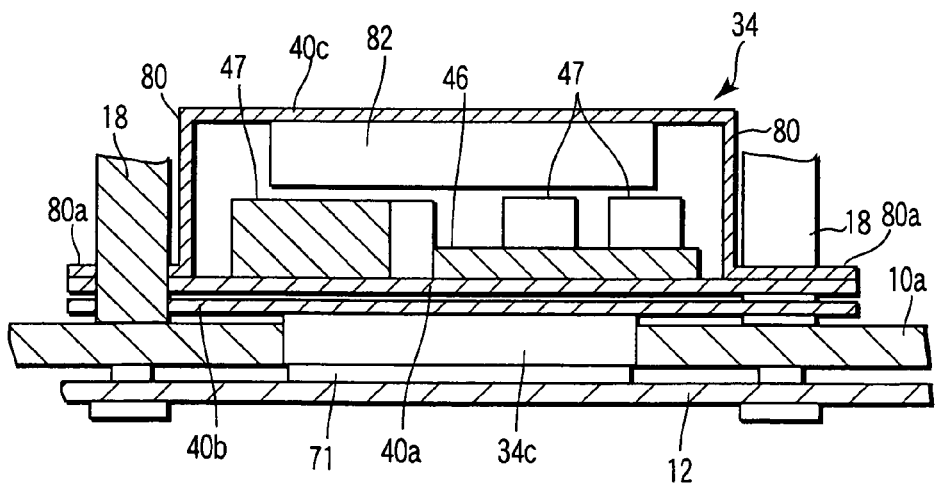
FIG. 8 is a cross-sectional view showing a board unit of an HDD according to a second embodiment of the present invention taken along line VIII—VIII of FIG. 9 with the first shell 10a and the control circuit board 12 added thereto.
Figure 9:
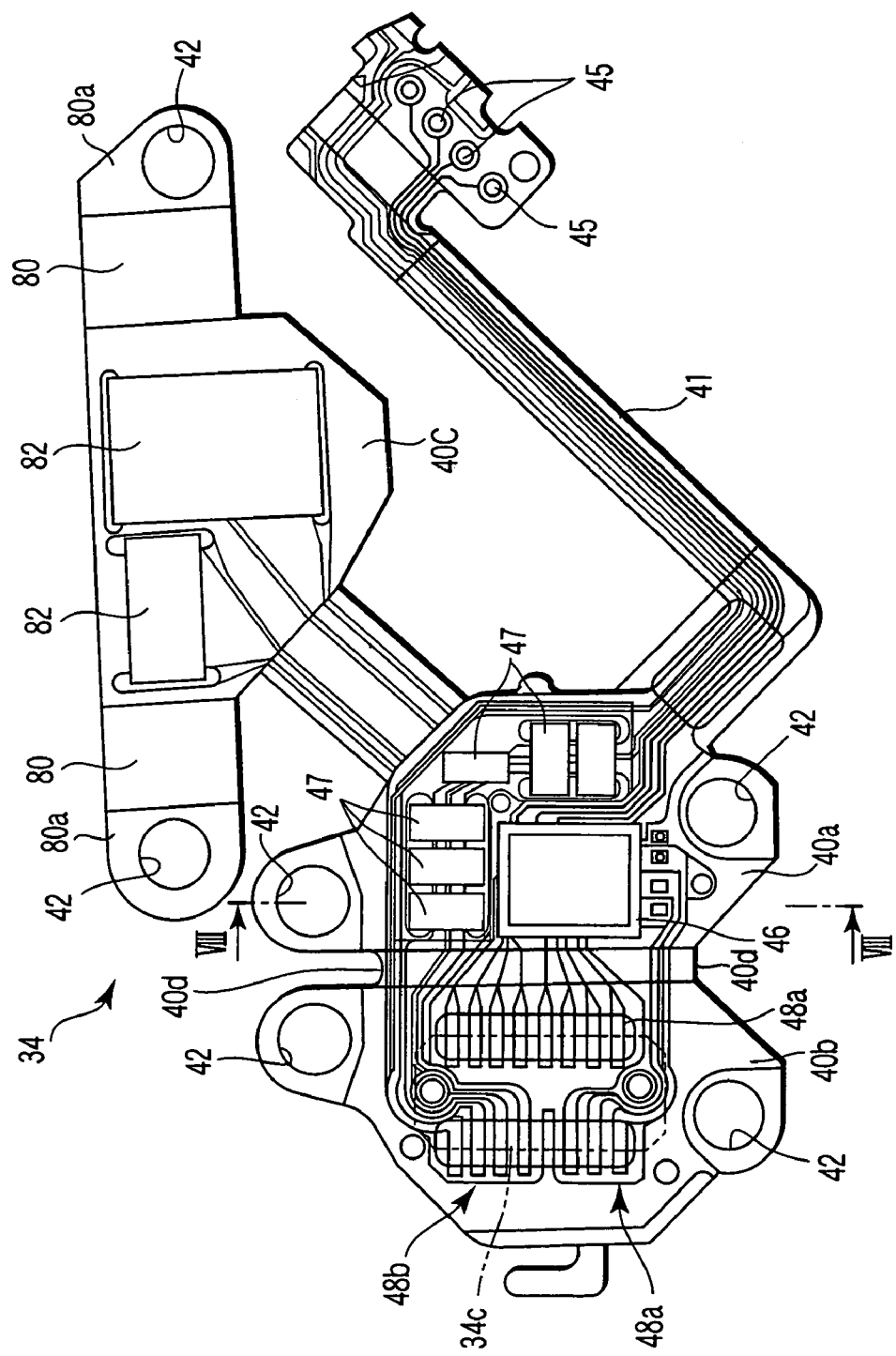
FIG. 9 is an exploded plan view of the board unit of the HDD according to the second embodiment.

As shown in FIG. 8 and FIG. 9, according to an HDD of the second embodiment of the present invention, the board main body 40 of the board unit 34 further has a second cover portion 40c in addition to the base portion 40a and cover portion 40b. The second cover portion 40c is formed of a flexible printed circuit board overlying and at least partially contacting the base portion 40a, and has a shape substantially similar to that of the base portion. The second cover portion 40c has a pair of leg sections 80 that extend outward, and the extended end 80a of each leg section is provided with a through hole 42. Two capacitors 82 for a retracting operation are mounted on the second cover portion 40c. The capacitors 82 are configured by tantalum capacitors with their capacities set to be, for example, 68 µF, 47 µF. Instead of the capacitors 82, an electric double layer capacitor of larger capacity may be arranged.

The second cover portion 40c is turned, facing the base portion 40a. The pair of the leg sections 80 are folded, forming the "L" shape, and are fixed to the first shell 10a by making the support posts 18 pass through the through holes 42 of the extended ends 80a. The capacitors 82 mounted on the second cover portion 40c face the capacitors 47 and head amplifier 46 mounted on the base portion 40a.

In the thus-configured second embodiment, advantages similar to those obtained in the first embodiment can be obtained. Furthermore, according to the second embodiment, a larger electric charge for a retracting operation can be secured by arranging further capacitors 82, which can move the magnetic heads to the retreated position easily when the power is turned off. Furthermore, the capacitors 82 can surely prevent the head amplifier 46 from being affected by impact.

The second embodiment shares the other configurations of the HDD with the first embodiment. Therefore, like reference numerals are used to designate like portions of the two embodiments, and a detailed description of those portions is omitted.

The present invention is not limited directly to the embodiments described above, and various changes or modifications may be effected therein without departing from the scope of the invention. Further, various inventions may be made by suitably combining a plurality of components described in connection with the foregoing embodiments. For example, some of the components according to the foregoing embodiments may be omitted. Furthermore, the components according to the different embodiments may be combined as required.

For example, the number of capacitors for a retracting operation can be increased or decreased according to need. The number of magnetic disk and that of magnetic heads are not restricted to one, and can be increased according to need. The diameter of the magnetic disk is not restricted to 0.85 inches, and can be 1.8 inches or 2.5 inches. Further, the present invention is not limited to magnetic disk drives, and may be also applied to any other disk drives, such as optical disk drive.

What is claimed is:

1. A disk drive comprising:
   a casing;
   a disk-shaped recording medium arranged in the casing;
   a drive motor which is arranged in the casing and which holds and rotates the recording medium;
   a head for performing read/write operations on the recording medium;
   a head actuator arranged in the casing and movably supporting the head to move the head relative to the recording medium, said head actuator performing a retracting operation to move the head to a retracted position with respect to the recording medium;
   a board unit arranged in the casing and connected to the head actuator, the board unit including a board main body arranged on an inner surface of the casing and a main flexible printed circuit board extending from the board main body and connected to the head actuator, the board main body and main flexible printed circuit board being integrally formed of a flexible printed circuit board;
   a control circuit board arranged on an outer surface of the casing and connected to the board unit; and
   at least one capacitor mounted on the board main body for supplying power to said head actuator during said retracting operation.

2. The disk drive according to claim 1, wherein said at least one capacitor includes a plurality of capacitors.

3. The disk drive according to claim 2 wherein said disk drive includes a head amplifier mounted on said board main body.

4. The disk drive according to claim 3 wherein the height from said board main body of at least one of said plurality of capacitors is larger than the height of said head amplifier.

5. The disk drive according to claim 4 wherein at least some of said plurality of capacitors are arranged closely adjacent said head amplifier.

6. The disk drive according to claim 3, wherein the board unit has a connector mounted on the board main body at the opposite side of the head amplifier, and the connector overlaps with the head amplifier.

7. The disk drive according to claim 2, wherein the total capacity of said plurality of capacitors is set to be more than or equal to 50 μF.

8. The disk drive according to claim 1, wherein the casing and the control circuit board have their longitudinal length set to be approximately 32 mm, width set to be approximately 24 mm, and thickness including the thickness of the casing and the control circuit board set to be approximately 3 mm to 6 mm.

9. The disk drive according to claim 1, wherein the recording medium has its diameter set to be 0.85 inch.

10. The disk drive according to claim 1, wherein the board unit includes an amplifier mounted on the board main body, and a plurality of capacitors mounted on the board main body and arranged around the amplifier.

11. The disk drive according to claim 1, wherein the board main body includes a base portion on which the capacitor is mounted, and a cover portion on which a connector is mounted, the board main body being folded and backs of the base portion and cover portion facing each other.

12. The disk drive according to claim 1, wherein the connector mounted on the cover portion is connected to the control circuit board through the casing.

13. A method of producing a small size disk drive which has a casing and elements positioned within the casing including, a recording medium, a drive motor for rotating the recording medium, a head for performing read/write operations on said recording medium, a head actuator for moving the head relative to the recording medium and for performing a retracting operation to move the head to a retracted position with respect to the recording medium and a board unit connected to the head actuator, said method comprising the steps of:
   mounting a board unit, having a board main body and a main flexible printed circuit board extending from the board main body and connected to the head actuator, the board main body and main flexible printed circuit board being integrally formed of a flexible printed circuit board, inside of said casing,
   mounting a control circuit board outside said casing and connecting with the board main body,
   mounting at least one capacitor inside said casing on the board main body, and
   utilizing said at least one capacitor to supply power to said head actuator during said retracting operation.

14. A method of protecting a head amplifier of a disk drive which has a casing and elements positioned within the casing including said head amplifier, a recording medium, a drive motor for rotating the recording medium, a head for performing read/write operations on said recording medium, a head actuator for moving the head relative to the recording medium and for performing a retracting operation to move the head to a retracted position with respect to the recording medium and a board unit which has a board main body and a main flexible printed circuit board extending from the board main body and connected to the head actuator, the board main body and main flexible printed circuit board being integrally formed of a flexible printed circuit board, said method comprising the steps of:

mounting a control circuit board outside said casing, and mounting at least one capacitor inside said casing on said board main body, utilizing said capacitors to supply power to said head actuator during said retracting operation, mounting said head amplifier on said board main body, and selecting a height of said at least one capacitor to be higher than the height of said head amplifier to protect said head amplifier.

* * * * *